United States Patent [19]

Enomoto et al.

[11] Patent Number: 5,340,491
[45] Date of Patent: Aug. 23, 1994

[54] ETCHANT FOR PRODUCTION OF ELECTRODE PLATE STRUCTURE FOR LIQUID CRYSTAL DISPLAY DEVICE

[75] Inventors: Takashi Enomoto, Zama; Masayuki Shimamune, Tokyo; Keishi Danjo, Yokohama, all of Japan

[73] Assignee: Canon Kabushiki Kaisha, Tokyo, Japan

[21] Appl. No.: 47,835

[22] Filed: Apr. 16, 1993

Related U.S. Application Data

[62] Division of Ser. No. 743,020, Aug. 9, 1991, Pat. No. 5,296,096.

[30] Foreign Application Priority Data

Aug. 13, 1990 [JP] Japan .............................. 2-211626
Aug. 5, 1991 [JP] Japan .............................. 3-218071

[51] Int. Cl.$^5$ ............................................. H01L 21/00
[52] U.S. Cl. ................................ 252/79.1; 252/79.2; 156/664; 156/656; 156/667
[58] Field of Search ........................ 252/79.1, 79.2; 156/664, 656, 667

[56] References Cited

U.S. PATENT DOCUMENTS

| | | | |
|---|---|---|---|
| 4,321,747 | 3/1982 | Takemura et al. | 437/181 |
| 4,767,723 | 8/1988 | Hinsberg et al. | 437/181 |
| 5,094,978 | 3/1992 | Miyagaki et al. | 156/650 |
| 5,105,291 | 4/1992 | Matsumoto et al. | 204/172.29 |
| 5,112,262 | 5/1992 | Obata et al. | 156/152 |
| 5,185,059 | 2/1993 | Nishida et al. | 156/667 |

*Primary Examiner*—R. Bruce Breneman
*Assistant Examiner*—George A. Goudreau
*Attorney, Agent, or Firm*—Fitzpatrick, Cella, Harper & Scinto

[57] ABSTRACT

An ITO (indium tin oxide) film on a substrate is effectively etched by an etchant which is an aqueous solution containing hydrogen iodide and ferric chloride to form an electrode plate structure for liquid crystal display device. The etchant does not corrode an Mo or Mo alloy film and accordingly can selectively etch the ITO film already carrying thereon a pattern of Mo or Mo alloy forming an auxiliary electrode for compensating for the resistivity of the ITO film. The etchant is also effective for etching of the ITO film formed on an organic layer.

6 Claims, 4 Drawing Sheets

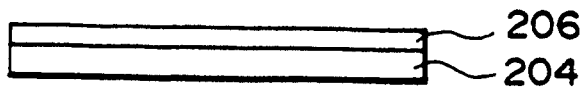
F I G. 2A
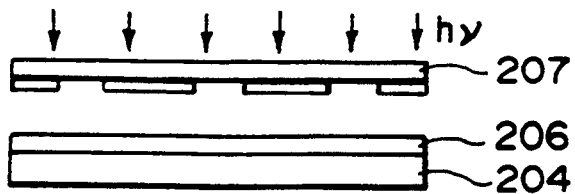
F I G. 2B
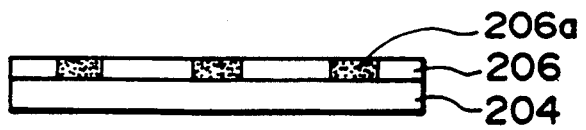
F I G. 2C
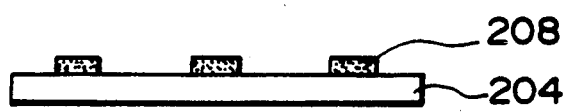
F I G. 2D
F I G. 2E
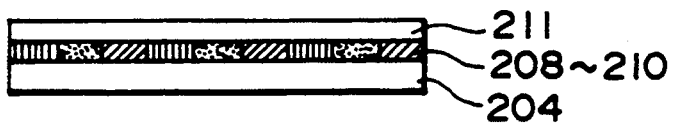
F I G. 2F

ETCHANT FOR PRODUCTION OF ELECTRODE PLATE STRUCTURE FOR LIQUID CRYSTAL DISPLAY DEVICE

This application is a division of application Ser. No. 743,020, filed Aug. 9, 1991, U.S. Pat. No. 5,296,096.

FIELD OF THE INVENTION AND RELATED ART

The present invention relates to an etchant, and a process for producing an electrode plate structure for a liquid crystal display device, particularly one having a fine electrode pattern of ITO (indium tin oxide).

In view of an increase in resistance of an ITO film having a relatively large resistivity accompanying a decrease in pixel size and an increase in panel size of a liquid crystal device (panel), it has been practiced in recent years to dispose a metal wire or narrow auxiliary electrode pattern along the ITO electrode pattern to provide a lower resistance. A typical example of a process for producing an electrode plate provided with such a metal wire pattern is illustrated in FIGS. 3A–3F.

Referring to these figures, a glass substrate 304 is first coated with an ITO film 301 (FIG. 3A) and further coated with a photoresist film 303, followed by photolithographic steps including exposure in a pattern of pixel electrodes (FIG. 3B), development, etching and removal of the remaining photoresist film, to form a pattern of ITO pixel electrodes 301 (FIG. 3C). Then, the ITO pixel electrodes 301 are coated with a metal film 302 (FIG. 3D) and further with a photoresist film 303a, followed by photolithographic steps including exposure in a pattern of metal wires (FIG. 3E), development, etching and removal of the remaining photoresist film to form patterned metal wires 302 along with the patterned ITO electrodes 301 on the substrate 304 (FIG. 3F).

For etching of the ITO film on the substrate to form a fine electrode pattern of ITO in the above-described conventional process for producing electrode plates for liquid crystal display devices, it has been practiced to use hydrochloric acid-type etchants, such as hydrochloric acid-ferric chloride mixture solution, and hydrochloric acid-nitric acid mixture solution; or hydrogen halide-type etchants, such as hydobromic acid and hydroiodic acid.

However, the use of a hydrochloric acid-type etchants, such as hydrochloric acid-ferric chloride mixture solution and hydrochloric acid-nitric acid mixture solution, has involved the following two difficulties.

(1) Undercut of the ITO pattern is liable to be caused due to penetration of the etchant to the boundary between the ITO and the photoresist film, thus being unsuitable for formation of a fine pattern required for a further decrease in pixel size of a liquid crystal display device.

(2) In the case of formation of an ITO pattern on an organic film, such as a color filter layer, the pattern edge is liable to be disordered for the same reason as above, and the peeling at the boundary between the organic film and the ITO is liable to be caused, thus causing a difficulty in pattern formation.

In the case of using hydrogen halide-type etchants, such as hydrobromic acid and hydroiodic acid, instead of the hydrochloric acid-type etchants involving the above problems, several advantages are attained such that they are suitable for fine patterning of ITO with little undercut and can be suitably used for formation of an ITO pattern on an organic film, such as a color filter layer. Another advantage of the use of hydrobromic acid or hydroiodic acid as an etchant for ITO is that it is possible to selectively etch the ITO film without etching Mo or Mo alloy used for forming metal wires (auxiliary electrodes).

Accordingly, in the case of forming such auxiliary-electrodes in order to compensate for the resistivity of ITO, it is possible to adopt a process wherein an ITO film and a metal film (of Mo or Mo alloy) are successively formed, and then a metal wire (or auxiliary electrode) pattern and an ITO electrode pattern are successively formed by patterning, thus avoiding troublesomeness of repeating similar steps two times, minimizing attachment of dust and lack of the substrate, and minimizing short circuit between the electrodes.

With the above advantages on one hand, the use of such a hydrogen halide-type etchant is accompanied with a difficulty that the etching rate therewith is sensitively affected by the film quality of ITO and the state of boundary between the ITO and the lower substrate so that partial etching failure (insufficiency) is liable to occur to result in short circuit between electrodes, particularly in the case of a large panel with a fine pattern (e.g., panel size of 300 mm×300 mm or larger and 2000×2000 pixels or more).

SUMMARY OF THE INVENTION

An object of the present invention is to provide an etchant and a process for producing an electrode plate structure for liquid crystal display device having solved the above-mentioned problems.

More specifically, it is an object of the present invention to provide an etchant for ITO capable of retaining the advantageous characteristics of a hydrogen fluoride-type etchant, such as hydrobromic acid or hydroiodic acid, i.e., (i) little undercut of ITO, (ii) capability of patterning of ITO on an organic film (such as color filter film or passivation film), and (iii) capability of selective etching of ITO in the presence of Mo or Mo alloy.

A further object of the present invention is to provide an etchant for ITO which is able to perform uniform etching of an ITO film without being adversely affected by the film quality of ITO and the state of boundary between the ITO and the lower substrate, thus being able to minimize the short-circuit between electrodes, while retaining the advantageous characteristics of a hydrogen halide-type etchant.

A further object of the present invention is to provide a process for producing an electrode plate using an etchant as described above.

According to the present invention, there is provided an etchant, comprising: an aqueous solution containing hydrogen iodide and ferric chloride.

According to another aspect of the present invention, there is provided a process for producing an electrode plate structure for liquid crystal display device, comprising: selectively etching an indium tin oxide film formed on a substrate with an etchant comprising an aqueous solution containing hydrogen iodide and ferric chloride to form an electrode pattern of the indium tin oxide film on the substrate.

These and other objects, features and advantages of the present invention will become more apparent upon a consideration of the following description of the preferred embodiments of the present invention taken in conjunction with the accompanying drawings.

PREFERRED EMBODIMENT OF THE INVENTION

The etchant according to the present invention may preferably contain hydrogen iodide at a concentration of 19–52 wt. %, particularly 24–48 wt. %, and ferric chloride at a concentration of 3–21 wt. %, particularly 6–18 wt. %.

The etchant according to the present invention may preferably be prepared by mixing hydroiodic acid (HI content: 47–57 wt. %) in a volume Va with a ferric chloride aqueous solution (FeCl$_3$ content: about 35 wt. %) in a volume Vb satisfying a relationship of $0.1 \leq Vb/Va \leq 1.5$, particularly $0.2 \leq Vb/Va \leq 1.0$.

In the range of $Vb/Va < 0.1$, the etching performance is liable to be affected by the ITO film quality or the lower substrate. In the range of $Vb/Va > 1.5$, iodide is liable to precipitate at room temperature and practical use can be prevented. The range of $0.2 \leq Vb/Va \leq 1.0$ is particularly advantageous for accomplishing a remarkable decrease in occurrence of short circuit between electrodes. The above volumetric ratio Vb/Va range may be also used for determining a preferred FeCl$_3$/HI content ratio based on the central HI concentration (52 wt. %) in the hydroiodic acid.

The ITO (indium tin oxide) film used for constituting transparent electrode may preferably be formed in a thickness of 500–3000 Å, particularly 700–2000 Å. The ITO film may preferably contain SnO$_2$ in a proportion of 1–15 wt. % of the ITO calculated as a mixture of In$_2$O$_3$ and SnO$_2$.

The metal wire (auxiliary electrode) formed along ITO electrode may preferably comprise Mo or an Mo alloy comprising (70 wt. % or more) of Mo and at least one metal selected from the group constituting of Ta, Ti, W, Cr and Al.

The metal wire may preferably be formed from a metal film having a thickness of 500–5000 Å, more preferably 1000–3000 Å.

Hereinbelow, some specific embodiments of the present invention will be described with reference to the drawings.

FIRST EMBODIMENT

FIGS. 1A–1G are schematic sectional views for illustrating an embodiment of the present invention.

Figure 1A:
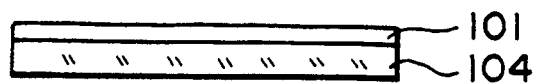
FIGS. 1A–1G are schematic sectional views for illustrating steps involved in an embodiment of the process for producing an electrode plate structure for liquid crystal display device according to the invention.
Figure 1B:
Figure 1C:
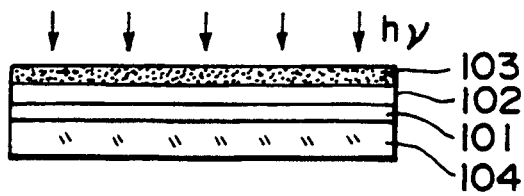

Referring to the figures, a glass substrate 104 was coated with a 2000 Å-thick ITO film by sputtering (FIG. 1A) and then with a 3000 Å-thick Mo (molybdenum) film 102 similarly by sputtering (FIG. 1B).

Figure 1D:
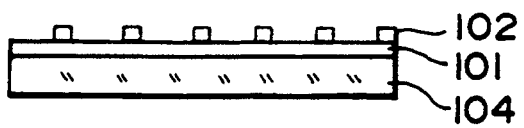
Figure 1E:
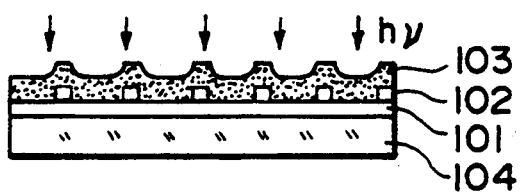

Then, a positive-type photoresist was applied onto the Mo film 102 to form an about 1 micron-thick photoresist film 103, which was then exposed through a metal wire pattern mask (FIG. 1C) and then developed, followed by 30 sec. by etching with phosphoric acid-nitric acid type etchant (a mixture of phosphoric acid (85 wt. %), nitric acid (60 wt. %), aetic acid (98 wt. %) and water in volumetric ratios of 16:1:2:1) at room temperature to form a metal wire pattern of molybdenum 102 (FIG. 1D).

Figure 1F:
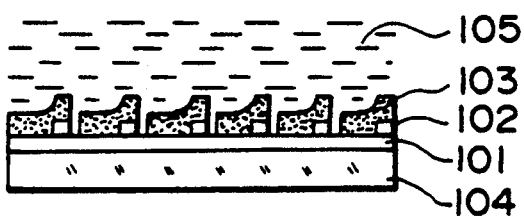
Figure 1G:
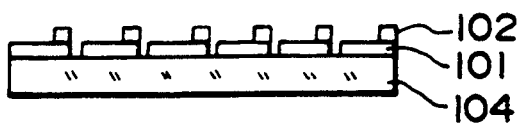

Then, the substrate provided with the metal wire pattern was further coated with an about 1 micron-thick photoresist film 103, which was then exposed through a pixel electrode pattern mask (FIG. 1D) and then developed. After the development, the structure was dipped for 120 sec in 50° C. of an etchant obtained by mixing a ferric chloride aqueous solution (FeCl$_3$ 35 wt. %) with a hydroiodic acid (HI 57 wt. %) in a volume ratio of 30% of the former with respect to the latter (FIG. 1F). After peeling off the resist film 103, an ITO film 101 in a pixel electrode pattern was formed (FIG. 1G).

The electrode pattern thus formed showed a pattern accuracy substantially identical to that obtained through a conventional process as explained with reference to FIGS. 3A 3F, i.e., one including two cycles of electrode film formation and photolithography, i.e., a first cycle of ITO film formation and its patterning, and a second cycle of Mo film formation and its patterning. Further, the mixture solution of hydroiodic acid and ferric chloride aqueous solution used as an etchant for the ITO film showed an excellent selective etching ability for ITO relative to Mo similarly as hydroiodic acid or hydrobromic acid, so that an extremely good electrode pattern could be formed without any corrosion of the Mo electrode pattern by the above embodiment which may be caused when an ordinary etchant (hydrochloric acid-nitric acid mixture or hydrochloric acid-ferric chloride mixture).

Then, the above embodiment process was repeated by using hydroiodic acid, hydrobromic acid and hydrochloric acid-ferric chloride mixture solution, respectively, instead of the hydroiodic acid-ferric chloride mixture solution, and the etching performance in each case was evaluated by electrically measuring an occurrence rate of short circuit between electrodes by using an auto-prober for an ITO stripe pattern of 200 micron width, 10 micron-spacing and 300 mm-length. The results are shown in Table 1 below.

TABLE 1

| Etchant for ITO | Short circuit occurrence rate |
| --- | --- |
| Hydroiodic acid-ferric chloride mixture solution | 1/2 × 10$^4$ |
| Hydroiodic acid | 1/1.5 × 10$^3$ |
| Hydrobromic acid | 1/1 × 10$^3$ |
| Hydrochloric acid-ferric chloride mixture solution | Mo electrode pattern formation failed due to corrosion |

As is clear from the results shown in Table 1, it was possible to uniformly etch the ITO film with minimum occurrence of short circuit between the resultant ITO electrodes by using a hydroiodic acid-ferric chloride mixture solution.

SECOND EMBODIMENT

FIGS. 2A–2M are sectional views for illustrating a second embodiment of the process for producing an electrode plate structure according to the present invention.

Figure 2G:
FIGS. 2A–2B are schematic sectional views for illustrating steps involved in another embodiment of the process for producing an electrode plate structure for liquid crystal display device according to the invention.
Figure 2H:
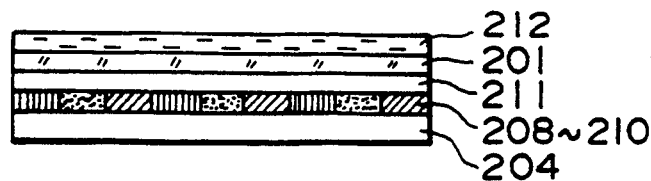
Figure 2I:
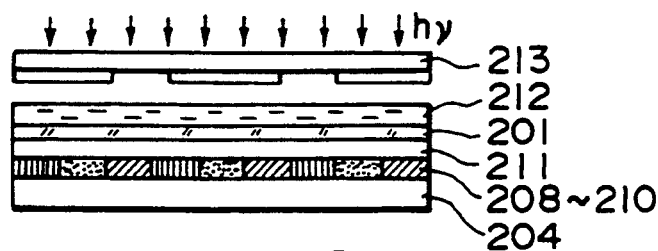
Figure 2J:
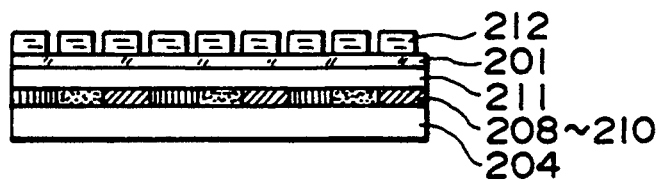
Figure 2K:
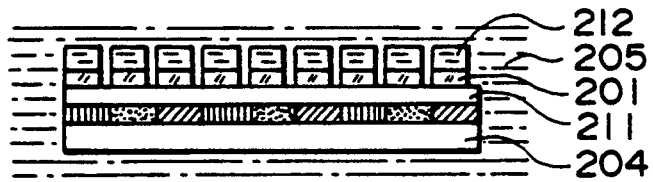
Figure 2L:
Figure 2M:
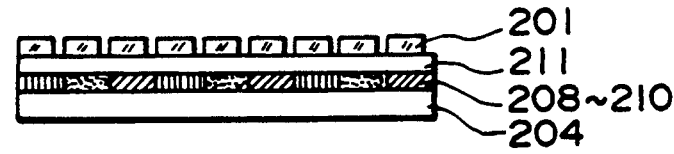

Referring to the figures, a glass substrate 204 was provided with color filter patterns of R(208), G(209) and B(210) each in a thickness of about 1.5 microns (FIG. 2E) through repetition of ordinary lithographic steps including application of a colored photosensitive polyamide resin 206 ("PA1012R", "PA1012G" and "PA1012B", available from Ube Kosan K.K.) (FIG. 2A), pattern exposure through a photomask 207 to form a photocured part 206a (FIGS. 2B and 2C) and development (FIG. 2D). Then, the color filter layer including the filter patterns 208–210 was further coated with an about 2 micron-thick protective layer 211 (photocured product of a photosensitive polyamide resin "PA100OC", available from Ube Kosan K.K.) (FIG. 2F). Then, the above treated substrate having a color filter pattern was further coated with an about 1000 Å-thick ITO film 201 by sputtering and heating at 250° C. (FIG. 2G) and a 1 micron-thick photoresist film 212 (FIG. 2H), followed by exposure through a prescribed electrode pattern mask 213 (FIG. 2I), development (FIG. 2J) and etching within a hydroiodic acid-ferric chloride mixture solution 205 at 50° C. (FIG. 2K). Then, the remaining photoresist film 212 (FIG. 2L) was peeled off to form an ITO pixel electrode pattern 211 (FIG. 2M).

The above embodiment process was repeated by using etchants obtained by mixing a ferric chloride aqueous solution ($FeCl_3$: 35 wt. %) in volume amounts of 0, 0.05, 0.1, 0.2, 0.3, 0.5 and 1.0, respectively, with one volume of hydroiodic acid (HI: 47 %).

The thus formed ITO electrode pattern in each case was free from thinning or irregularity of the pattern due to the etching to retain a good shape apparently by naked eye observation. Further, the color filter pattern of the photosensitive polyamide formed below the ITO film was not damaged at all.

The short circuit occurrence rates obtained in the respective cases using different etching compositions are summarized in the following Table 2.

TABLE 2

| $HI:FeCl_3$ volume rate | Short circuit occurrence rate |
| --- | --- |
| 1:0 | $1/1.5 \times 10^3$ |
| 1:0.05 | $1/1.8 \times 10^3$ |
| 1:0.1 | $1/8 \times 10^3$ |
| 1:0.2 | $1/1.8 \times 10^4$ |
| 1:0.3 | $1/2 \times 10^4$ |
| 1:0.5 | $1/2.2 \times 10^4$ |
| 1:1 | $1/2.5 \times 10^4$ |

As is clear from the above Table 2, the occurrence rate of short circuit between electrodes could be remarkably decreased by using the ferric chloride aqueous solution in a volume ratio of 0.1 or above with respect to 1 volume of the hydroiodic acid. Table 2 also shows that a volume ratio of the ferric chloride solution of 0.2 or above provided a further remarkably decreased short-circuit occurrence rate. Incidentally, when the volume ratio of the ferric chloride aqueous solution exceeded 1.5, iodine precipitated at room temperature so that practical use was impossible.

THIRD EMBODIMENT

An electrode plate structures for liquid crystal display device was prepared in the same manner as in Example 1 except that the metal film 102 was formed by a molybdenum-tantalum (Mo-Ta) alloy (Ta content: 10 wt. %) instead of Mo.

Uniform selective etching of ITO film relative to the Mo-Ta alloy auxiliary electrode pattern and minimization of short circuit occurrence rate were also possible in this embodiment to provide a good electrode plate structure for liquid crystal display device.

An electrode plate structure prepared as described above may be fixed to a similar electrode plate structure with or without a color filter layer with an appropriate spacer therebetween and the periphery thereof is sealed with an epoxy adhesive, etc. to form a cell structure, into which a liquid crystal is injected through an injection port. Then, the injection port is sealed to form a liquid crystal cell (display device). The electrode plate structure according to the present invention may be used for any type of liquid crystals inclusive of a conventional TN-liquid crystal, basically, but most suitably be used for a ferroelectric liquid crystal.

What is claimed is:

1. An etchant, comprising: an aqueous solution containing hydrogen iodide and ferric chloride, wherein the hydrogen iodide is contained at a concentration of 19–52 wt. %, and the ferric chloride is contained at a concentration of 3–21 wt. %.

2. An etchant according to claim 1, wherein the hydrogen iodide is contained at a concentration of 24–48 wt. %, and the ferric chloride is contained at a concentration of 6–18 wt. %.

3. An etchant, comprising: an aqueous solution containing hydrogen iodide and ferric chloride, which is a mixture solution of 0.1–1.5 volume of a ferric chloride aqueous solution having an $FeCl_3$ content of about 35 wt. % with one volume of hydroiodic acid having an HI content of 47–57 wt. %.

4. An etchant according to claim 3, which is a mixture solution of 0.2–1 volume of a ferric chloride aqueous solution having an $FeCl_3$ content of about 35 wt. % with one volume of hydroiodic acid having an HI content of 47–57 wt. %.

5. An etchant according to claim 1, which is an etchant for selective etching of an indium tin oxide film in contact with a pattern of molybdenum or molybdenum alloy film formed on the indium tin oxide film.

6. An etchant according to claim 3, which is an etchant for selective etching of an indium tin oxide film in contact with a pattern of molybdenum or molybdenum alloy film formed on the indium tin oxide film.

* * * * *

UNITED STATES PATENT AND TRADEMARK OFFICE
CERTIFICATE OF CORRECTION

PATENT NO. : 5,340,491
DATED : August 23, 1994
INVENTOR(S) : TAKASHI ENOMOTO, ET AL.

It is certified that error appears in the above-identified patent and that said Letters Patent is hereby corrected as shown below:

COLUMN 1

Line 48, "a" should be deleted.

COLUMN 3

Line 9, "FIGS. 2A-2B" should read --FIGS. 2A-2M--.
Line 51, "constituting" should read --consisting--.

COLUMN 4

Figure 3A:
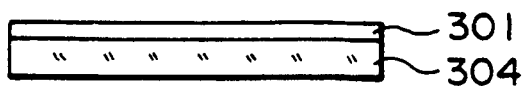
FIGS. 3A–3F are schematic sectional views for illustrating patterning steps involved in a conventional process for producing an electrode plate structure for liquid crystal display device.
Figure 3B:
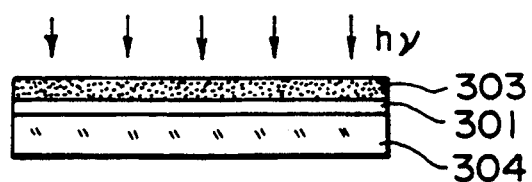
Figure 3C:
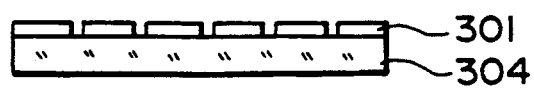
Figure 3D:
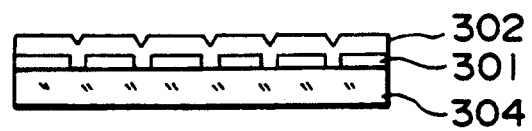
Figure 3E:
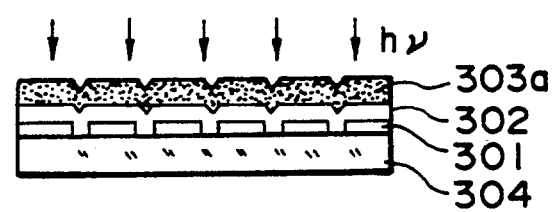
Figure 3F:
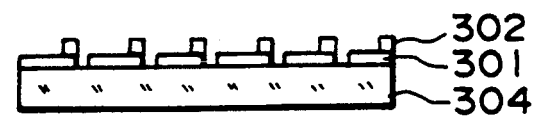

Line 23, "FIGS. 3A 3F," should read --FIGS. 3A-3F,--.

COLUMN 5

Line 14, ""PA1000C"," should read --"PA1000C",--.
TABLE 2, "volume rate" should read --volume ratio--.

UNITED STATES PATENT AND TRADEMARK OFFICE
CERTIFICATE OF CORRECTION

PATENT NO. : 5,340,491
DATED : August 23, 1994
INVENTOR(S) : TAKASHI ENOMOTO, ET AL.

It is certified that error appears in the above-identified patent and that said Letters Patent is hereby corrected as shown below:

<u>COLUMN 6</u>

Line 6, "structures" should read --structure--.

Signed and Sealed this

Eleventh Day of April, 1995

Attest:

BRUCE LEHMAN

Attesting Officer

Commissioner of Patents and Trademarks